(12) United States Patent
Fukuta (10) Patent No.: US 10,005,625 B2
(45) Date of Patent: Jun. 26, 2018

(54) PLATE SUPPORT BODY AND CONVEYANCE APPARATUS

(71) Applicant: Sakai Display Products Corporation, Sakai-shi, Osaka (JP)

(72) Inventor: Takahiro Fukuta, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 143 days.

(21) Appl. No.: 15/032,527

(22) PCT Filed: Oct. 16, 2014

(86) PCT No.: PCT/JP2014/077569
§ 371 (c)(1),
(2) Date: Apr. 27, 2016

(87) PCT Pub. No.: WO2015/064374
PCT Pub. Date: May 7, 2015

(65) Prior Publication Data
US 2016/0257504 A1  Sep. 8, 2016

(30) Foreign Application Priority Data

Oct. 29, 2013 (JP) .................................. 2013-224488

(51) Int. Cl.
| | |
|---|---|
| *B65G 49/06* | (2006.01) |
| *H01L 21/677* | (2006.01) |
| *H01L 21/687* | (2006.01) |

(52) U.S. Cl.
CPC ......... *B65G 49/063* (2013.01); *B65G 49/061* (2013.01); *H01L 21/67706* (2013.01);
(Continued)

(58) Field of Classification Search
CPC .... B65G 35/06; B65G 49/061; B65G 49/063; H01L 21/6734; H01L 21/67706;
(Continued)

(56) References Cited

U.S. PATENT DOCUMENTS

| | | | | |
|---|---|---|---|---|
| 2,618,905 A | * | 11/1952 | Dicks ..................... | C03B 35/205 |
| | | | | 211/41.14 |
| 7,922,882 B2 | * | 4/2011 | Yoshida ............... | B65G 49/061 |
| | | | | 118/668 |

(Continued)

FOREIGN PATENT DOCUMENTS

| | | |
|---|---|---|
| JP | H5-58429 A | 3/1993 |
| JP | H10-41369 A | 2/1998 |

(Continued)

*Primary Examiner* — Leslie A Nicholson, III
*Assistant Examiner* — Keith R Campbell
(74) *Attorney, Agent, or Firm* — Rudy J. Ng; Bret E. Field; Bozicevic, Field & Francis LLP (57) ABSTRACT

A plate support body detachably supports a plate in a vertical position. The plate support body comprises a base body disposed in a direction along a peripheral edge of the plate, and a plurality of placing members which are juxtaposed in the direction along the peripheral edge and respectively protrude from the base body, a peripheral edge part of the lower side of the plate being placed on the placing members. A first placing member corresponding to a central part of the peripheral edge part of the lower side of the plate in the direction along the peripheral edge has the shortest protruded length from the base body, and a second placing member corresponding to either end of the peripheral edge part of the lower side of the plate in the direction along the peripheral edge has a constant protruded length from the base body.

3 Claims, 6 Drawing Sheets

(52) U.S. Cl.
CPC .. *H01L 21/67712* (2013.01); *H01L 21/68785* (2013.01); *H01L 21/68778* (2013.01)

(58) Field of Classification Search
CPC ......... H01L 21/67712; H01L 21/68735; H01L 21/6875; H01L 21/68778; H01L 21/68785; C03B 35/205; C03B 35/207
See application file for complete search history.

(56) References Cited

U.S. PATENT DOCUMENTS

| | | | | |
|---|---|---|---|---|
| 8,550,441 | B2* | 10/2013 | Ishino | B65G 49/061 269/111 |
| 2006/0245848 | A1* | 11/2006 | Wang | H01L 21/6734 414/217 |
| 2010/0126415 | A1* | 5/2010 | Ishino | B65G 49/061 118/500 |
| 2014/0017903 | A1* | 1/2014 | Bello | H01L 21/2007 438/758 |

FOREIGN PATENT DOCUMENTS

| | | | |
|---|---|---|---|
| JP | 2007-262539 A | | 10/2007 |
| JP | 2007262539 A | * | 10/2007 |

* cited by examiner

PLATE SUPPORT BODY AND CONVEYANCE APPARATUS

CROSS-REFERENCE TO RELATED APPLICATIONS

This application is the national phase under 35 U. S. C. § 371 of PCT International Application No. PCT/JP2014/077569 which has an International filing date of Oct. 16, 2014 and designated the United States of America.

FIELD

The present invention relates to a plate support body which supports a plate and a conveyance apparatus.

BACKGROUND

A liquid crystal panel included in a liquid crystal display apparatus is formed by using a glass substrate which is rectangular. The glass substrate has a metal film having translucency formed on one surface of the glass substrate.

Forming of the metal film on the glass substrate is performed by a film forming apparatus (see Japanese Patent Laid-Open Publication No. 2007-262539, which is hereinafter referred to as Patent Document 1).

The film forming apparatus described in Patent Document 1 includes a substrate holder part holding a glass substrate in a vertical position, and a carrier on which the substrate holder part is mounted. The film forming apparatus forms a metal film on one surface of the glass substrate by moving the carrier inside of a chamber while conveying the glass substrate along a prescribed path.

The substrate holder part described in Patent Document 1 includes a frame body which encloses peripheral edge parts of the glass substrate, and a plurality of placing parts (substrate receiving parts' in text thereof) on which a lower part of the glass substrate is placed. The plurality of placing parts are juxtaposed in a direction along the lower part of the glass substrate, and respectively protrude from the frame body.

The glass substrate in a vertical position may tend to be deformed into a convex shape in a downward direction due to a stress caused by its own weight, thermal expansion during film formation or the like. If a protruded length of each placing part from the frame body is constant, a large pressure occurs between the glass substrate which may tend to be deformed in the downward direction and the placing part on which the glass substrate is placed. As a result, the glass substrate may be broken.

However, the placing part described in Patent Document 1 has elasticity. Therefore, the placing part is elastically deformed in the downward direction along with the downward deformation of the glass substrate. Thereby, an occurrence of large pressure between the glass substrate and the placing part is suppressed.

SUMMARY

However, since the protruded length of the placing part having elasticity (hereinafter, referred to as an elastic placing part) from the frame body is variable, it is difficult to position the glass substrate with respect to the frame body. Further, the elastic placing part has a more complicated configuration than a placing part having a constant protruded length from the frame body (hereinafter, referred to as a constant placing part).

Nonetheless, the constant placing part has advantages that it has a simple structure and the glass substrate may be easily positioned with respect to the frame body, but has a disadvantage that breaking of the glass substrate may occur as described above.

However, a force that the glass substrate may tend to be deformed due to the stress caused by its own weight, thermal expansion during film formation, or the like is largest in a central part of a lower side of the glass substrate. Accordingly, when using the constant placing part, a place, in which the pressure occurring between the glass substrate and the placing part becomes largest, is concentrated at one place (specifically, between the central part of the lower side of the glass substrate and the placing part).

In consideration of the above-described circumstances, it is a major object of the present invention to provide a plate support body which has a simple structure and is capable of allowing for easy positioning of a plate, as well as may suppress a damage to the plate, and a conveyance apparatus.

A plate support body according to one embodiment of the present invention detachably supports a plate in a vertical position. The plate support body comprises a base body disposed in a base body disposed in a direction along a peripheral edge of the plate, and a plurality of placing members which are juxtaposed in the direction along the peripheral edge and respectively protrude from the base body, a peripheral edge part of a lower side of the plate being placed on the placing members. Among the placing members, a first placing member corresponding to a central part of the peripheral edge part of the lower side of the plate in the direction along the peripheral edge has the shortest protruded length from the base body, and a second placing member corresponding to either end of the peripheral edge part of the lower side of the plate in the direction along the peripheral edge has a constant protruded length from the base body.

In the plate support body according to the embodiment of the present invention, among the placing members, a third placing member disposed between the first placing member and the second placing member has a protruded length increased or decreased from the base body.

A conveyance apparatus according to one embodiment of the present invention conveys a plate supported by the plate support body according to the present invention. The conveyance apparatus comprises a holding body configured to detachably hold the plate support body, and a moving unit configured to move the holding body.

According to the embodiment of the present invention, in the plate support body, the peripheral edge part of the lower side of the plate in the vertical position is placed on a plurality of placing members including the first placing member and the second placing member.

The first placing member corresponds to the central part of the peripheral edge part of the lower side of the plate in the direction along the peripheral edge of the plate (hereinafter, referred to as a central part of the peripheral edge part of the lower side of the plate). The first placing member has the shortest protruded length from the base body. That is, the protruded length of the second placing member from the base body is longer than that of the first placing member.

The second placing member corresponds to one or the other of the plate in the peripheral edge part of the lower side of the plate in the direction along the peripheral edge of the plate. The second placing member is the constant placing member, and protrude from the base body. Therefore, the plate may be easily positioned with respect to the base body, by being placed on the second placing member.

The first placing member and the second placing member are juxtaposed in a direction from the one to the other of the plate in the direction along the peripheral edge of the plate in order of the second placing member, the first placing member, and the second placing member.

Therefore, even when the plate may tend to be deformed into a convex shape in a downward direction, it is unlikely to result in a large pressure between the central part of the peripheral edge part of the lower side of the plate and the first placing member. The reason is that, when the deflection of the plate is small, the plate comes in contact with at least two second placing members while does not come in contact with the first placing member. In addition, when the deflection of the plate is large, the plate comes strongly in contact with at least two second placing members while comes lightly in contact with the first placing member.

Regardless of a magnitude of the deflection of the plate, a place, in which the pressure occurring between the plate and the placing members becomes largest, is not concentrated at one place (specifically, between the central part of the peripheral edge part of the lower side of the plate and one first placing member, or a plurality of adjacent first placing members), but is dispersed to two places (specifically, between both sides of the plate in the direction along the peripheral edge of the plate from the central part of the peripheral edge part of the lower side of the plate and at least two second placing members disposed apart from each other through the first placing member). Therefore, it is unlikely to result in a large pressure between the plate and the second placing member.

From the above result, damage to the plate is suppressed.

By holding and moving the plate support body as described above, the conveyance apparatus may convey the plate without significantly changing its own configuration of the conveyance apparatus from that of the conventional conveyance apparatus, and without damaging to the plate.

According to the embodiment of the present invention, the third placing member may be disposed between the first placing member and the second placing member. At least one second placing member is disposed corresponding to each of the one and the other of the plate in the direction along the peripheral edge of the plate, such that the number of the third placing members is also at least two. Briefly, the first placing member, the second placing member, and the third placing member are juxtaposed in the direction from the one to the other of the plate in the direction along the peripheral edge of the plate in order of the second placing member, the third placing member, the first placing member, the third placing member, and the second placing member. In addition, the protruded length of the third placing member from the base body may be increased or decreased.

The protruded length of the third placing member from the base body, according to the deflection of the plate, may be an intermediate length between the protruded length of the first placing member from the base body and the protruded length of the second placing member from the base body. Thereby, even when the plate may tend to be deformed into a convex shape in the downward direction, it is unlikely to result in a large pressure between the central part of the peripheral edge part of the lower side of the plate and the first placing member. The reason is that, when the deflection of the plate is small, the plate comes in contact with the second placing member and the third placing member while does not come in contact with the first placing member. In addition, because that, when the deflection of the plate is large, the plate comes strongly in contact with the second placing member and the third placing member while comes lightly in contact with the first placing member.

Regardless of the magnitude of the deflection of the plate, the place, in which the pressure occurring between the plate and the placing members becomes largest, is not concentrated at one place, but is dispersed to two places (specifically, between both sides of the plate in the direction along the peripheral edge of the plate from the central part of the peripheral edge part of the lower side of the plate and at least a total of four second placing members and third placing members, which are disposed apart from each other through the first placing member). Therefore, the pressure occurring between the plate and the second placing member may be smaller than the case of not including the second placing member. Of course, it is unlikely to result in a large pressure between the plate and the third placing member.

From the above result, damage to the plate is further suppressed.

According to the plate support body and the conveyance apparatus of the present invention, two types of placing members having different protruded lengths from each other are appropriately disposed. Further, in the two types of the placing members, the constant placing member has a longer protruded length.

From the above result, the plate support body and the conveyance apparatus have a simpler configuration than the case in which all of the placing members are elastic placing members, and the plate may be easily positioned. Further, damage to the plate may be suppressed.

The above and further objects and features will more fully be apparent from the following detailed description with accompanying drawings.

DETAILED DESCRIPTION

Hereinafter, the present invention will be described in detail with reference to the accompanying drawings illustrating embodiments thereof. In the following description, upper and lower, back and front, and right and left illustrated by arrows in the drawings are used.

Embodiment 1

Figure 1:
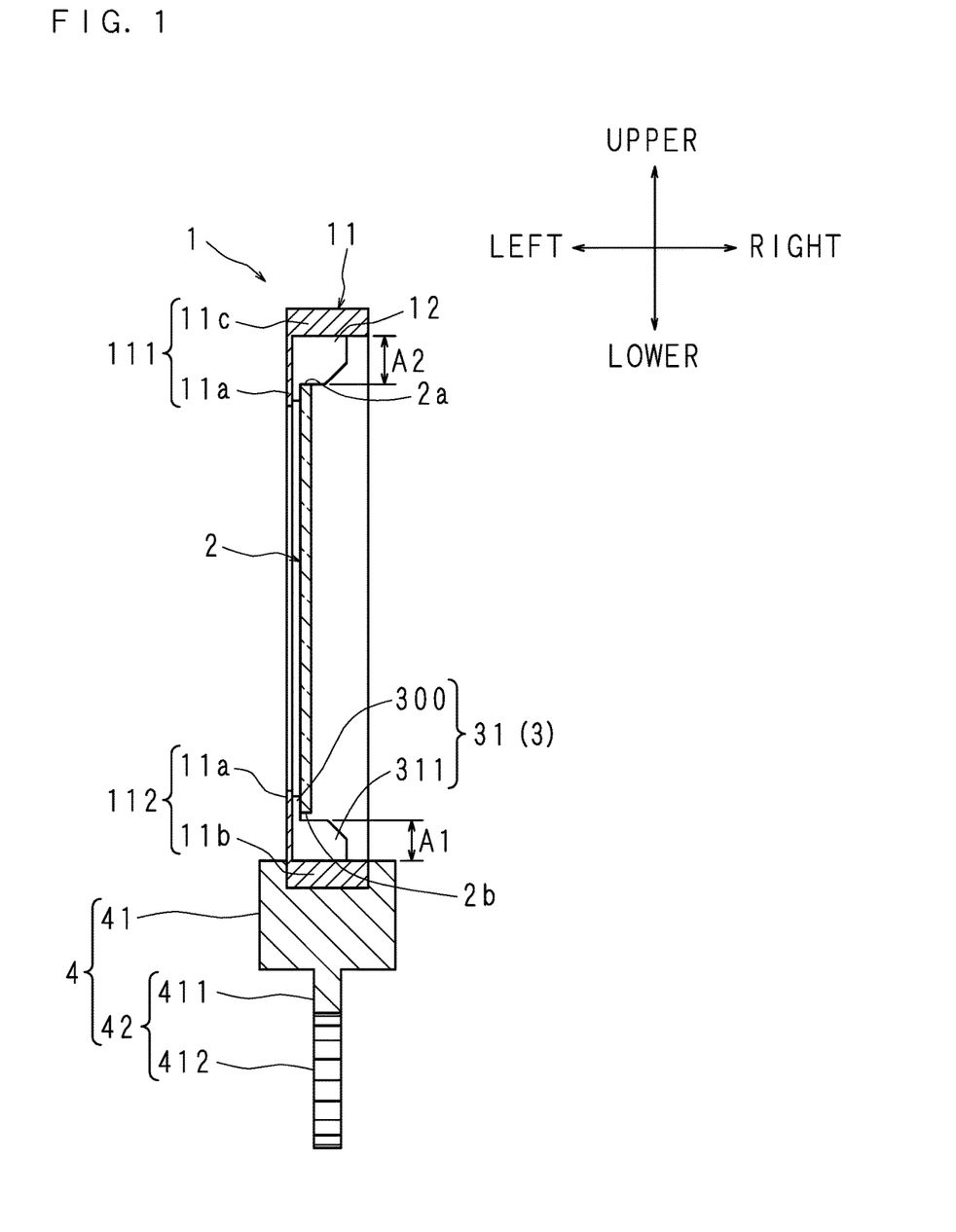
FIG. 1 is a longitudinal-sectional view schematically illustrating a configuration of a plate support body and a conveyance apparatus according to Embodiment 1 of the present invention.
Figure 2:
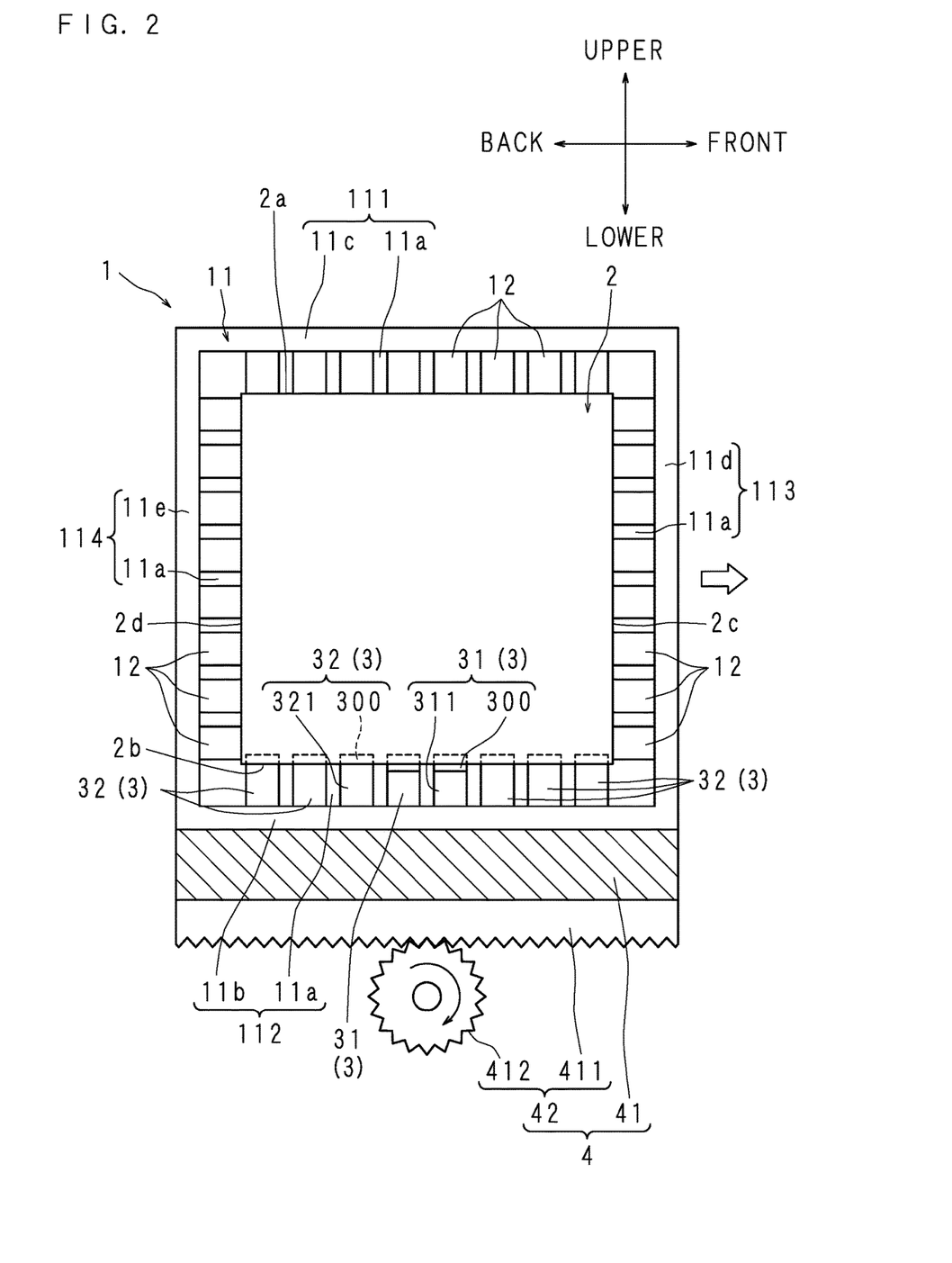
FIG. 2 is a side view schematically illustrating the configuration of the plate support body and the conveyance apparatus.

FIG. 1 is a longitudinal-sectional view schematically illustrating a configuration of a plate support body 1 and a conveyance apparatus 4 according to Embodiment 1 of the present invention, and FIG. 2 is a side view thereof.

First, a plate 2 will be described.

The plate 2 is formed in a rectangular plate shape. The plate 2 is, for example, a brittle member such as a glass substrate. In the present embodiment, a metal film is formed on one surface of the plate 2 by a film forming apparatus to be described below. Further, the plate 2 is not limited to the substrate made of glass. The plate 2 in FIG. 2 is a square shape, but may be a rectangular shape.

The plate 2 is supported by a plate support body 1 in a vertical position along a back-and-front direction. Hereinafter, four peripheral edge parts of the plate 2 are referred to as an upper part 2a, a lower part (peripheral edge part of the lower side) 2b, a front part 2c, and a rear part 2d.

The plate 2 disposed in the vertical position, in particular, a longitudinal central part thereof may be deformed into a convex shape in a downward direction due to a deflection caused by its own weight, thermal expansion or the like.

Next, the plate support body 1 will be described.

The plate support body 1 may have the same configuration as the conventional plate support body, except for including placing members 3, 3 and . . . to be described below instead of the conventional placing members.

The plate support body 1 of the present embodiment detachably supports the plate 2 in the vertical position along the back-and-front direction. For this purpose, the plate support body 1 includes a base body 11, a plurality of support members 12, 12 and . . . , and a plurality of placing members 3, 3 and . . . .

The base body 11 is formed in a rectangular frame shape enclosing the four peripheral edge parts of the plate 2. The base body 11 integrally has an upper frame part 111, a lower frame part 112, a front frame part 113, and a rear frame part 114, which are an L bar shape, respectively, and should be respectively disposed along the upper part 2a, the lower part 2b, the front part 2c, and the rear part 2d of the plate 2.

Each of the upper frame part 111 and the lower frame part 112 is disposed in a horizontal position. The upper frame part 111 and the lower frame part 112 are top-bottom symmetrical shapes. Each of the front frame part 113 and the rear frame part 114 is disposed in the vertical position. The front frame part 113 and the rear frame part 114 are front-back symmetrical shapes.

The lower frame part 112 integrally has a left plate part 11a corresponding to one side of the L shape, and a lower frame body 11b corresponding to the other side of the L shape. The left plate part 11a is formed in a flat plate shape in the vertical position. The lower frame body 11b protrudes from a lower end part of the left plate part 11a in a backward direction.

Similarly, the upper frame part 111 (the front frame part 113 or the rear frame part 114) integrally has a left plate part 11a corresponding to one side of the L shape, and an upper frame body 11c (a front frame body 11d or a rear frame body 11e) corresponding to the other side of the L shape. The upper frame body 11c (the front frame body 11d or the rear frame body 11e) protrudes from an upper end part (a front end part or a rear end portion) of the left plate part 11a in the backward direction.

The lower frame body 11b of the lower frame part 112 has the plurality of placing members 3, 3 and . . . which protrude upward on an upper part thereof. The placing members 3, 3 and . . . are juxtaposed in the back-and-front direction (that is, a direction along a peripheral edge of the lower part 2b of the plate 2).

Hereinafter, M parts of the placing members 3, 3 and . . . are referred to as first placing members 31 and 31. However, M is a prescribed natural number. FIG. 2 illustrates a case of M=2 by an example.

The first placing members 31 and 31 are disposed adjacent to each other at the longitudinal central part of the lower frame part 112, so as to correspond to the longitudinal central part in the lower part 2b of the plate 2 (that is, a central part of the lower part 2b of the plate 2).

Hereinafter, the other parts of the placing members 3, 3 and . . . other than the first placing members 31 and 31 are referred to as second placing members 32, 32 and . . . . N second placing members 32, 32 and . . . are disposed on the front and a rear of the lower frame part 112, respectively, so as to either end of the back-and-front direction in the lower part 2b of the plate 2. However, N is a prescribed natural number. FIG. 2 illustrates a case of N=3 by an example.

Briefly, N second placing members 32, 32 and . . . , two first placing members 31 and 31, and N second placing members 32, 32 and . . . are juxtaposed from the front side to the rear side in this order.

Figure 3:
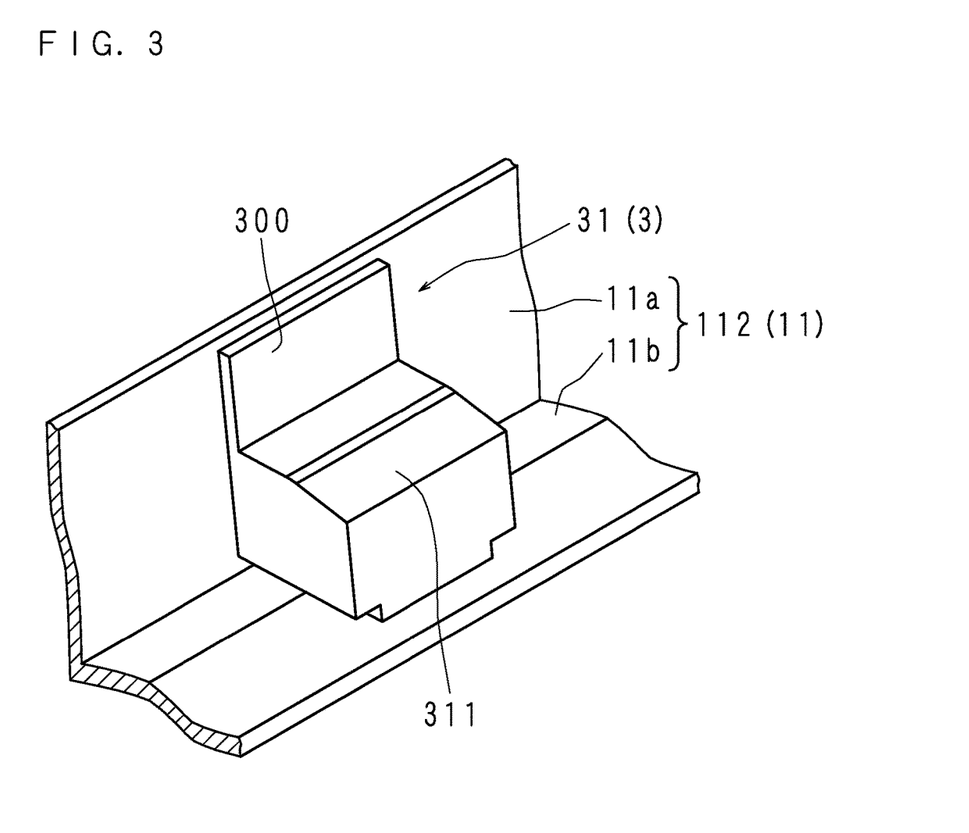
FIG. 3 is a perspective view illustrating an appearance of a first placing member included in the plate support body.

FIG. 3 is a perspective view illustrating an appearance of the first placing member 31.

Herein, the first placing member 31 will be described in detail with reference to FIGS. 1 to 3.

Each first placing member 31 has a protruded length which is a prescribed protruded length A1 from the lower frame body 11b of the lower frame part 112. That is, the first placing member 31 is a constant placing member having a constant protruded length from the base body 11.

The first placing member 31 integrally has a placing base part 311 and a contact plate part 300.

The placing base part 311 is formed in a rectangular parallelepiped shape in the horizontal position whose longer direction is along the back-and-front direction. The contact plate part 300 protrudes from an upper surface of the placing base part 311. The contact plate part 300 is a rectangular plate shape, and is disposed so that a left surface of the contact plate part 300 and a left surface of the placing base part 311 are in the same level as each other.

A lower surface of the placing base part 311 comes in contact with the lower frame body 11b of the lower frame part 112, and a left surface of the placing base part 311 and the left surface of the contact plate part 300 come in contact with the left plate part 11a of the lower frame part 112, such that the first placing member 31 is attached to the lower frame part 112. Briefly, the first placing member 31 is disposed inside of a corner formed by the left plate part 11a and the lower frame body 11b of the lower frame part 112.

A vertical length (the length in a vertical direction) from the lower surface of the placing base part 311 to an upper end face of the contact plate part 300 is shorter than the protruded length of the left plate part 11a from the lower frame body 11b in the lower frame part 112.

In the present embodiment, the vertical length from the lower surface to the upper surface of the placing base part 311 is the protruded length A1.

Next, the second placing member 32 will be described in detail with reference to FIGS. 1 and 2.

Each second placing member 32 has a protruded length which is a prescribed protruded length A2 from the lower frame body 11b of the lower frame part 112. That is, the second placing member 32 is the constant placing member having a constant protruded length from the base body 11.

The second placing member 32 integrally has a placing base part 321 and a contact plate part 300.

The contact plate part 300 of the second placing member 32 corresponds to the contact plate part 300 of the first placing member 31.

The placing base part 321 of the second placing member 32 is substantially the same shape as the placing base part 311 of the first placing member 31. However, the vertical length from a lower surface to an upper surface of the placing base part 321 is the protruded length A2. In addition, the protruded length A2 is longer than the protruded length A1. In other words, among the placing members 3, 3 and . . . , the protruded length A1 of the first placing member 31 from the base body 11 is the shortest.

Next, the support member 12 will be described.

The configuration of each support member 12 in the present embodiment is the same as the configuration of the second placing member 32. Briefly, the support member 12 integrally has a support base part and a contact plate part corresponding to the placing base part 321 and the contact plate part 300 of the second placing member 32.

However, the support members 12, 12 and . . . protrude from the upper frame part 111, the front frame part 113, and the rear frame part 114, respectively. In this case, the support members 12, 12 and . . . are disposed inside of corners formed by the left plate part 11a and the upper frame body 11c (the front frame body 11d or the rear frame body 11e) of the upper frame part 111 (the front frame part 113 or the rear frame part 114).

The upper frame body 11c of the upper frame part 111 has a plurality of support members 12, 12 and . . . which protrude downward. The support members 12, 12 and . . . in the upper frame part 111 are juxtaposed in the back-and-front direction.

The front frame body 11d of the front frame part 113 (or the rear frame body 11e of the rear frame part 114) has a plurality of support members 12, 12 and . . . which protrude reward (or forward). The support members 12, 12 and . . . in the front frame part 113 (or the rear frame part 114) are juxtaposed in the vertical direction.

Further, the configuration of the support member 12 may be the same as the configuration of the first placing member 31, and may be different from the configuration of the placing member 3.

Next, attaching of the plate 2 to the plate support body 1 will be described.

The plate 2 is fitted, from the right side of the base body 11, in a space enclosed by the support members 12, 12 and . . . on an upper side, the placing members 3, 3 and . . . on a lower side, and the support members 12, 12 and . . . on both front and rear sides.

In this case, the left surface of the plate 2 is disposed in contact with the contact plate part of each support member 12 and the contact plate part 300 of each placing member 3.

In addition, the upper end face, the front end face, and the left end face of the plate 2 come in contact with support convex parts of the respective support members 12, 12 and . . . on the upper side and the support members 12, 12 and . . . on the both front and rear sides. Briefly, the upper part 2a, the front part 2c, and the rear part 2d of the plate 2 are supported by the support members 12, 12 and . . . on the upper side and the support members 12, 12 and . . . on the both front and rear sides.

Further, a lower end face of the plate 2 comes in contact with the placing base part 321 of each second placing member 32. Briefly, the lower part 2b of the plate 2 is placed on the placing members 3, 3 and . . . (more specifically, the second placing members 32, 32 and . . . ).

From the above result, the plate 2 is pinched between the support members 12, 12 and . . . on the upper side and the placing members 3, 3 and . . . , to be positioned in the vertical direction with respect to the base body 11. And, the plate 2 is pinched between the support members 12, 12 and . . . on the both front and rear sides, to be positioned in the back-and-front direction with respect to the base body 11.

Further, the plate 2 is pressed from the right side to the left side by a plate retainer (not illustrated) which is detachably attached to the base body 11. As a result, the plate is pinched between the contact plate pasts of the respective support members 12, 12 and . . . , the contact plate parts 300, 300 and . . . of the placing members 3, 3 and . . . , and the plate retainer, to be positioned in a right-and-left direction with respect to the base body 11.

If removing the plate retainer, the plate 2 may be easily removed from the support members 12, 12 and . . . , and the placing members 3, 3 and . . . (that is, from the plate support body 1)

Next, action effects of the plate support body 1 will be described.

Figure 4:
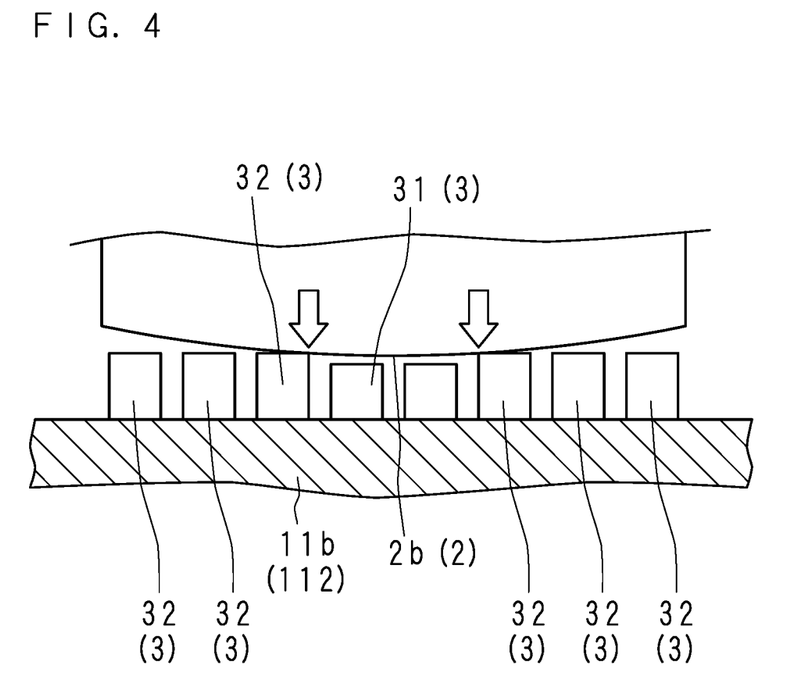
FIG. 4 is a side view schematically illustrating a state in which a plate is placed on the placing members included in the plate support body.

FIG. 4 is a side view schematically illustrating a state in which the plate 2 is placed on the placing members 3, 3 and . . . . In FIG. 4, each contact plate part 300 is not illustrated.

Figure 5:
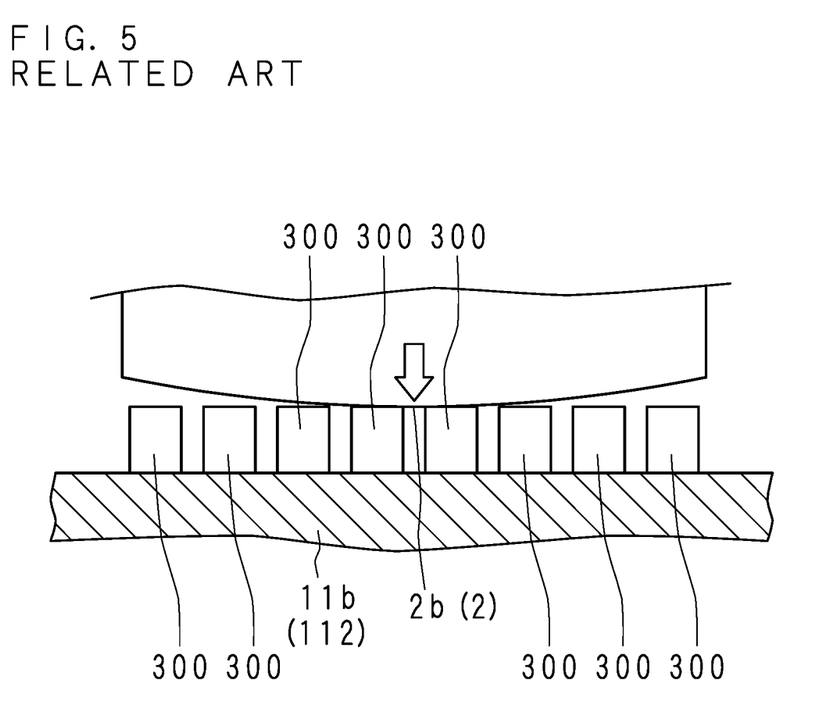
FIG. 5 is a side view schematically illustrating a state in which the plate is placed on placing members included in a conventional plate support body.

FIG. 5 is a side view schematically illustrating a state in which the plate is placed on placing members 300, 300 and . . . included in a conventional plate support body.

First, a difference between the plate support body 1 and the conventional plate support body will be described.

The configuration of the conventional plate support body is the same as the configuration of the plate support body 1. However, all the plurality of placing members 300, 300 and . . . included in the conventional plate support body are the constant placing member having the same configuration as the second placing member 32 of the plate support body 1.

Both in a case of being supported by the plate support body 1 and in a case of being supported by the conventional plate support body, the plate 2 may tend to be deformed into a convex shape in the downward direction. A force that the plate 2 may tend to be deformed is largest in the central part of the lower part 2b of the plate 2.

However, a deflection of the plate 2 due to a deflection caused by the own weight of the plate 2, thermal expansion, or the like is very small as compared with the vertical length and a horizontal length of the plate 2. In addition, since the plate 2 is pinched between the support members 12, 12 and . . . on the upper side and the second placing members 32, 32 and . . . on the lower side (or the placing members 300, 300 and . . . ), the lower part 2b of the actual plate 2 is not largely separated from the second placing members 32, 32 and . . . (or the placing members 300, 300 and . . . ) in an upward direction. Nonetheless, in FIGS. 4 and 5, the state of plate 2 is exaggeratedly represented so as to easily understand the state of the plate 2.

As illustrated in FIG. 5, in the case of plate 2 supported by the conventional plate support body, a pressure occurs between the plate 2 which may tend to be deformed in the downward direction and the placing members 300, 300 and . . . . In this case, a place, in which the pressure between the plate 2 and the placing members 300, 300 and . . . becomes largest, is the central part of the lower part 2b of the plate 2, and between two placing members 300 and 300 adjacent to the longitudinal central part of the base body 11.

That is, in the conventional plate support body, the place, in which the pressure between the plate 2 and the placing members 300, 300 and . . . becomes largest, is concentrated at one place. As a result, the plate 2 may be damaged.

Meanwhile, as illustrated in FIG. 4, even in the case of the plate 2 supported by the plate support body 1, a pressure occurs between the plate 2 which may tend to be deformed in the downward direction and the placing members 3, 3 and . . . . However, in this case, an occurrence of a large pressure between the central part of the lower part 2b of the plate 2 and two first placing members 31 and 31 adjacent to the longitudinal central part of the base body 11 is suppressed.

The reason is that, the protruded length A1 relating to each first placing member 31 is shorter than the protruded length A2 relating to each second placing member 32. Therefore, if the deflection of the plate 2 is relatively small (see FIG. 4), the plate 2 does not come in contact with the first placing members 31 and 31, and comes in contact with the second placing members 32 and 32 each of which are located on both front and rear sides of the first placing members 31 and 31. Alternately, if the deflection of the plate 2 is relatively large (not illustrated), the plate 2 comes lightly in contact with the first placing members 31 and 31, and comes strongly in contact with the second placing members 32 and 32 each of which are located on both front and rear sides of the first placing members 31 and 31.

That is, in the plate support body 1, the place, in which the pressure between the plate 2 and the placing members 3, 3 and . . . becomes largest, is dispersed to two places. As a result, damage to the plate 2 is suppressed.

Next, a conveyance apparatus 4 will be described with reference to FIGS. 1 and 2.

The conveyance apparatus 4 may have the same configuration as the conventional conveyance apparatus, except for using the plate support body 1 instead of the conventional plate support body.

The conveyance apparatus 4 of the present embodiment conveys the plate 2 supported by the plate support body 1 in a forward direction along a conveying path of the plate 2. For this purpose, the conveyance apparatus 4 includes a holding body 41 and a moving unit 42.

The holding body 41 detachably holds one plate support body 1, or each of a plurality of plate support bodies 1, 1 and . . . juxtaposed in the back-and-front direction. The plate support body 1 is mounted on the upper part of the holding body 41.

The moving unit 42 includes a linear gear 411, a plurality of circular gears 412, 412 and . . . (one gear is illustrated in FIGS. 1 and 2, respectively) and the like.

The linear gear 411 protrudes downward from a lower part of the holding body 41 in the back-and-front direction. The linear gear 411 is meshed with at least one of the plurality of circular gears 412, 412 and . . . .

The plurality of circular gears 412, 412 and . . . are juxtaposed in the back-and-front direction in the vertical position in which rotation axes thereof are along the right-and-left direction. Each circular gear 412 is an external teeth flat gear. The circular gear 412 is rotated in one direction (rotated forward in FIG. 2) by transmitting a rotational motion output from a motor (not illustrated) through a belt, a chain (each of which is not illustrated) or the like.

Further, the moving unit 42 includes a guide rail along the back-and-front direction, rollers which are driven while being guided by the guide rail (each of which is not illustrated) and the like. The guide rail is laid along the conveying path of the plate 2. The rollers are rotatably supported by the holding body 41.

By meshing the linear gear 411 with the circular gear 412, the rotation of the circular gear 412 is converted into a linear motion (forward movement) of the linear gear 411. When the linear gear 411 linearly moves, the holding body 41 moves in the forward direction. In this case, the holding body 41 moves while stably supported by the guide rail through the rollers. As a result, the plate 2 supported by the plate support body 1 is conveyed in the forward direction.

The conveyance apparatus 4 configured as described above is assembled in a film forming apparatus (not illustrated). The film forming apparatus includes a plate exchange chamber, an L (load-lock) chamber, a heating chamber, and a film forming chamber. The plate 2 before film formation is conveyed from the plate exchange chamber to the L chamber, the heating chamber, and the film forming chamber in this order, and the plate 2 after film formation is conveyed from the film forming chamber to the heating chamber, the L chamber, and the plate exchange chamber in this order.

In the plate exchange chamber, the plate 2 after film formation is removed from the plate support body 1, and the plate 2 before film formation is attached to the plate support body 1.

An inside of the L chamber is transferred from an atmospheric state to a vacuum state as the plate 2 is carried into the heating chamber, and is transferred from the vacuum state to the atmospheric state as the plate 2 is carried out of the plate exchange chamber.

When the plate 2 has reached the film forming chamber via the heating chamber, a metal film is formed on one surface of the plate.

When the conventional plate support body is used, in particular, during when the plate 2 is conveyed from the L chamber to the plate exchange chamber, the plate 2 is likely to be damaged. Actually, when film forming processing for the plurality of plates 2, 2 and . . . is performed using the conventional plate support body, a rate of the number of damaged sheets to the number of the sheets on which the film forming processing is performed (rate of damage) was 0.036%.

However, when the plate support body 1 is used, an occurrence of damage in the plate 2 is suppressed. Actually, when the film forming processing for the plurality of plates 2, 2 and . . . is performed using the plate support body 1, the rate of damage was 0.011%.

Further, the plate 2 is positioned by the support members 12, 12 and . . . , and the placing members 3, 3 and . . . , such that a film forming accuracy by the film forming apparatus may be improved.

Furthermore, the first placing members (or the second placing members) in the embodiments of the present invention are not limited to the configuration having the same dimension and the same shape as each other, as the first placing members 31 and 31 (or the second placing members 32, 32 and . . . ) of the present embodiment. In addition, the number of the second placing members is not limited to the configuration in which the same number of the plurality of placing members are disposed on both sides of the first placing member, and may be one by one, or a combination of one (a small number of part and a plurality of (a multitude of) parts. Further, the shape of the placing members 3, 3 and . . . is not limited to the shape of the present embodiment.

Embodiment 2

Figure 6:
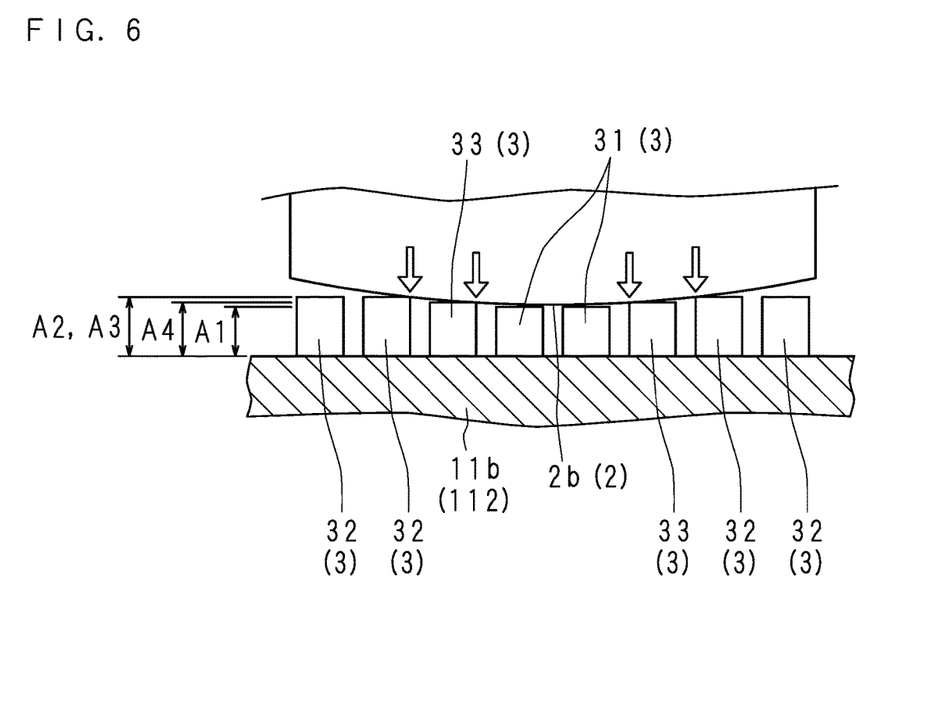
FIG. 6 is a side view schematically illustrating a state in which the plate is placed on placing members included in a plate support body according to Embodiment 2 of the present invention.

FIG. 6 is a side view schematically illustrating a state in which the plate 2 is placed on the placing members 3, 3 and . . . included in the plate support body 1 according to Embodiment 2 of the present invention. FIG. 6 corresponds to FIG. 4 of Embodiment 1.

A plate support body 1 and a conveyance apparatus 4 of the present embodiment have substantially the same configuration as the plate support body 1 and the conveyance apparatus 4 of Embodiment 1. Hereinafter, a difference from Embodiment 1 will be described, and the other portions corresponding to Embodiment 1 will be denoted by the same reference numerals, and will not be described.

Embodiments 1 and 2 are different from each other in terms of the configuration of the placing members 3, 3 and . . . .

The placing members 3, 3 and . . . of Embodiment 1 includes two first placing members 31 and 31 adjacent to each other, and three second placing members 32, 32 and . . . on each of both front and rear sides of the first placing members 31 and 31.

Meanwhile, the placing members 3, 3 and . . . of the present embodiment correspond to a configuration in which the plurality of second placing members 32, 32 and . . . are substituted into the same number of third placing members 33, 33 and . . . , in the placing members 3, 3 and . . . of Embodiment 1. Hereinafter, a case in which two second placing members 32 and 32 are substituted into two third placing members 33 and 33 will be described.

One part of the two third placing members 33 and 33 is disposed between the first placing member 31 on the front side and the second placing members 32, 32 and . . . on the front side, and the other part is disposed between the first placing member 31 on the rear side and the second placing members 32, 32 and . . . on the rear side.

Briefly, two second placing members 32 and 32, one third placing member 33, two first placing members 31 and 31, one third placing member 33, and two second placing members 32 and 32 are juxtaposed from the front side to the rear side in this order.

Each third placing member 33 integrally has a placing base part and a contact plate part corresponding to the placing base part 321 and the contact plate part 300 of the second placing member 32. The third placing member 33 is attached to the lower frame part 112, similarly to the second placing member 32. Briefly, the third placing member 33 is disposed inside of a corner formed by the left plate part 11*a* and the lower frame body 11*b* of the lower frame part 112.

However, the protruded length of the third placing member 33 from the lower frame body 11*b* of the lower frame part 112 may be increased or decreased within a prescribed range. For this purpose, at least the placing base part of the third placing member 33 has elasticity. When a downward external force is applied to an upper surface of the placing base part of the third placing member 33, the placing base part thereof is elastically deformed in a direction in which the upper surface of the placing base part approaches the lower surface. Briefly, the third placing member 33 is an elastic placing member which is elastically deformed in the downward direction.

Hereinafter, the protruded length of the third placing member 33 from the base body 11 during no-load is referred to as a protruded length A3. In the present embodiment, the protruded length A3 is equal to the protruded length A2. Meanwhile, the shortest protruded length of the third placing member 33 from the base body 11 during when the above-described external force is applied to the third placing member 33 is shorter than the protruded length A2.

Further, the protruded length A3 is not limited to the configuration of equal to the protruded length A2, but longer than the protruded length A1.

The lower end face of the plate 2 attached to the plate support body 1 comes in contact with the placing base part 321 of each second placing member 32, and also comes in contact with the placing base part of each third placing member 33. Briefly, the lower part 2*b* of the plate 2 is placed on the placing members 3, 3 and . . . (more specifically, the second placing members 32, 32 and . . . and the third placing members 33 and 33).

The protruded length relating to each third placing member 33 becomes a protruded length A4 by placement of the plate 2 (that is, application of the external force). Herein, the protruded length A4 is shorter than the protruded length A3 (that is, the protruded length A2), and longer than the protruded length A1.

Therefore, if the deflection of the plate 2 is relatively small, the plate 2 does not come in contact with the first placing members 31 and 31, and comes in contact with each one second placing member 32 and the third placing member 33 adjacent to each other on the front side of the first placing members 31 and 31, and each one second placing member 32 and the third placing member 33 adjacent to each other on the rear side of the first placing members 31 and 31 (see FIG. 6). Alternately, if the deflection of the plate 2 is relatively large, the plate 2 comes lightly in contact with the first placing members 31 and 31, and comes strongly in contact with the second placing members 32 and 32 and the third placing members 33 and 33, which are located on both front and rear sides of the first placing members 31 and 31 (not illustrated). In either case, the protruded length A4 relating to each third placing member 33 becomes an intermediate length between the protruded length A1 relating to the first placing member 31 and the protruded length A2 relating to the second placing member 32.

Accordingly, an occurrence of large pressure between the central part of the lower part 2*b* of the plate 2 and two first placing members 31 and 31 adjacent to the longitudinal central part of the base body 11 is suppressed. Briefly, in the plate support body 1, the place, in which the pressure between the plate 2 and the placing members 3, 3 and . . . becomes largest, is dispersed to two places. Further, in Embodiment 1, the load is applied to two second placing members 32 and 32, but in the present embodiment, the load is applied to a total of four second placing members 32 and 32 and the third placing members 33 and 33. From the above result, damage to the plate 2 is further suppressed.

The third placing members 33 and 33 are the elastic placing members. Therefore, if all of the placing members 3, 3 and . . . are the third placing members 33, 33 and . . . , positioning of the plate 2 in the vertical direction is difficult. However, in the present embodiment, there are no particular problems since positioning of the plate 2 in the vertical direction is performed between the support members 12, 12 and . . . and the second placing members 32, 32 and . . . .

However, if all of the placing members 3, 3 and . . . are the third placing members 33, 33 and . . . , since the load is dispersed to the entirety of the third placing members 33, 33 and . . . , it is considered that damage to the plate 2 is more suppressed than in Embodiments 1 and 2. Nonetheless, also in Embodiment 1, the rate of damage is 0.011%, which is sufficiently practical. Accordingly, it is not necessary that all of the placing members 3, 3 and . . . are the third placing members 33, 33 and . . . .

The third placing member 33 of the present embodiment has the configuration in which the protruded length of the third placing member 33 is naturally controlled to an optimal length by the elasticity thereof, according to the placement of the plate 2. However, the third placing member of the embodiment of the present invention is not limited to the above-described configuration. For example, the third placing member may have a configuration including a hollow placing base part, a placing convex part which retractably protrudes from the placing base part, and an elastic part which is housed inside of the placing base part and presses the placing convex part in a protruding direction. In addition, for example, the third placing member may have a configuration including the placing convex part which retractably protrudes from the placing base part, and an operation part for manually increasing or decreasing the protruding amount of the placing convex part from the placing base part by a worker.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

In addition, as long as having the effects of the present invention, components which are not disclosed in Embodiments 1 and 2 may be included in the plate support body 1 or the conveyance apparatus 4.

Components (technical characteristics) disclosed in each embodiment may be combined with each other, and by combining these components, new technical characteristics may be formed.

It is noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

The invention claimed is:

1. A support body detachably supporting a rectangular flat plate, comprising:
   a base body comprising an upper frame part and a lower frame part extending in a first direction, and two vertical frame parts extending in a second direction perpendicular to the first direction, wherein these four frame parts are integrated as a rectangular frame to surround a peripheral edge of the rectangular flat plate; and
   a plurality of placing members protruded from an upper surface of the lower frame part toward the inside of the base body, the placing members being juxtaposed along the longitudinal direction of the lower frame part, wherein,
   a first placing member provided at central portion of the lower frame part in the longitudinal direction thereof has a protruded length from the lower frame part shorter than that of any one of the placing members except for the first placing member, and
   positions of at least one second placing members provided at a first region between a first end in the longitudinal direction of the lower frame part and the first placing member are symmetrical to positions of at least one third placing members provided at a second region between a second end in the longitudinal direction of the lower frame part and the first placing member with respect to the first placing member, and
   the protruded length of each of the second placing members from the lower frame part is equal to the protruded length of each of the third placing members from the lower frame part.

2. The plate support body according to claim 1, wherein,
   a first elastic placing member is disposed between the first placing member and a specific second placing member closest to the first placing member, and
   a second elastic placing member is disposed between the first placing member and a specific third placing member closest to the first placing member, wherein
   the first and second elastic placing members being elastically deformed in a direction approaching the lower frame part when an external force is applied toward the lower frame part to a protruded end of each of the first and second elastic placing members, so that a protruded length of the first or second elastic placing member from the lower frame part is variable within the range from the protruded length of the first placing member to that of the second or third placing members.

3. A conveyance apparatus, comprising:
   a holding body detachably holding the support body according to claim 1; and
   a moving unit moving the holding body, wherein
   the first direction and the second direction are a horizontal direction and a vertical direction, respectively, and
   the holding body holds the support body so that the lower frame part is placed lower than the upper frame part.

\* \* \* \* \*

UNITED STATES PATENT AND TRADEMARK OFFICE
CERTIFICATE OF CORRECTION

PATENT NO.         : 10,005,625 B2
APPLICATION NO.    : 15/032527
DATED              : June 26, 2018
INVENTOR(S)        : Takahiro Fukuta Page 1 of 1

It is certified that error appears in the above-identified patent and that said Letters Patent is hereby corrected as shown below:

In the Claims

Please delete "plate" in Claim 2 (Column 14, Line 23).

Signed and Sealed this
Twenty-third Day of October, 2018

Andrei Iancu
*Director of the United States Patent and Trademark Office*